(12) United States Patent
Gillespie et al.

(10) Patent No.: US 7,775,803 B2
(45) Date of Patent: Aug. 17, 2010

(54) ELECTRICAL CONNECTOR HAVING CONTACT RETENTION DEVICE

(75) Inventors: Brian J. Gillespie, Harrisburg, PA (US); Tod M. Harlan, Mechanicsburg, PA (US); Kevin E. Walker, Hershey, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 190 days.

(21) Appl. No.: 12/288,648

(22) Filed: Oct. 22, 2008

(65) Prior Publication Data

US 2010/0167564 A1  Jul. 1, 2010

(51) Int. Cl.
*H01R 12/00* (2006.01)

(52) U.S. Cl. .......................................... 439/66; 439/71
(58) Field of Classification Search .................. 439/66, 439/70, 71
See application file for complete search history.

(56) References Cited

U.S. PATENT DOCUMENTS

| | | | |
|---|---|---|---|
| 5,244,396 A | 9/1993 | Matsuoka | |
| 5,820,389 A | 10/1998 | Hashiguchi | |
| 6,083,022 A | 7/2000 | Walkup | |
| 6,447,304 B1 | 9/2002 | Korsunsky | |
| 7,503,770 B2 * | 3/2009 | Fan | 439/66 |
| 2004/0259394 A1 * | 12/2004 | Chiang | 439/66 |
| 2005/0233606 A1 * | 10/2005 | Liao et al. | 439/66 |
| 2007/0281501 A1 * | 12/2007 | Ju | 439/66 |
| 2008/0050939 A1 * | 2/2008 | Polnyi | 439/66 |

* cited by examiner

*Primary Examiner*—Hien Vu
(74) *Attorney, Agent, or Firm*—Andrew C. Cheng; Wei Te Chung; Ming Chieh Chang

(57) ABSTRACT

The present invention provides an electrical connector comprising an insulative housing having a plurality of passageways, and a plurality of contacts received in the passageways, respectively. The passageways each defines two inner walls opposite to each other, the two inner walls each having at least one first retention device. The contacts each include a base, an upper arm extending from one side of the base and a lower arm extending from another side. The upper arm further defines two protrusions on opposite sides thereof and the lower arm defines two protrusions on opposite sides thereof. In assembly, protrusions on upper arm are located above the first retention device of the passageways, and protrusions on the lower arm are located below the first retention device of the passageways such that movement of the contact in the passageway along length axis of the passageway is limited in a predetermined distance.

5 Claims, 12 Drawing Sheets

ELECTRICAL CONNECTOR HAVING CONTACT RETENTION DEVICE

BACKGROUND OF THE INVENTION

1. Field of the Invention

The present invention relates to the art of electrical connectors. In detail, the present invention relates to a central processing unit (CPU) socket, and more particularly to a socket that has an insulative housing with contact retaining structure.

2. Background of the Invention

Electrical connection between two terminals is generally facilitated by normal force exerted from one terminal to the other. However, since surface of the terminal could be contaminated by dust or oxidation, it is preferable to generate a wiping displacement between two terminals during mating. With the wiping displacement between the terminals, dust or oxidation on the terminal could be wiped out, thereby ensuring reliable electrical connection between two mated terminals.

U.S. Pat. No. 5,244,396 issued to Matsuoka on Sep. 13, 1993 discloses an arrangement for electrical connector in which contact 9 is obliquely arranged and which may provide a wiping displacement between contact 9 and element 4. However, Matsuoka's device is too complicated to implement.

In Matsuoka device, element 11 is insert molded within element 1, while contact 9 is moveably arranged within the element 11. The contact 9 includes a pair of arms 8 which can be deformed when the contact 9 is pushed downwardly by element 4. As stated above, the Matsuoka device is too complicated to be implemented in the socket connector for used with a CPU. (U.S. Pat. No. 6,083,022 discloses another oblique arrangement of the contacts in the connector housing.

U.S. Pat. No. 5,820,389 issued to Hashiguchi on Oct. 13, 1998, discloses an electrical connector to be used between a printed circuit board and a LSI (Large Scale Integration) circuit of the type which is disclosed in Japanese Utility Model Publication (B) No. 13191/1995 (hereinafter referred to as the '191 Publication). Since the '191 device can not provide enough wiping displacement between the contacting end and a corresponding conductive pad, Hashiguchi (the '389 patent) then provides an improvement on the arrangement of the contact such that a contact end thereof may perform an effective wiping displacement over a corresponding pad to ensure an effective electrical connection.

As shown in FIGS. 9A, 9B and 9C, the contact 20 is arranged in a passageway formed vertically in the housing 10. The contact 20 includes an extension 24 having a free end 24b. Theoretically, when contact end 23a is depressed by the element 200, contact end 24b will displace from its original position. It is understandable that Hashiguchi device is better than the '191 device as the extension 24 displace more than that of the '191 device. However, since the contact 20 is vertically arranged within the passageway, it is unlikely that the contact end 23a to perform a wiping displacement with respect to the corresponding element 200. Understandably, Hashiguchi solves only portion of the problem encountered by the '191.

On the other hand, even the extension 24 is arranged obliquely, the wiping displacement conducted by the contact end 24b is still not enough since before the contact end 24b is moved when the portion 23a is moved vertically down, there is a deformation incurred in portion 21a. Accordingly, Hashiguchi still leaves an opening for further improvement.

By the way, Hashiguchi does not meet the requirement since only the contact end 24b displaces a short distance over a conductive pad, while the contact end 23 does not displace when it is contacting with corresponding conductive pad.

U.S. Pat. No. 6,447,304 issued to Korsunsky discloses a first electrical device similar to the above described, and includes a first substrate having at least a first conductive pad formed thereon. A second electrical device includes a second substrate having at least a second conductive pad formed thereon. An electrical device is arranged between first and second electrical devices for electrically connecting the first and second conductive pads of the first and second electrical devices. The electrical device includes a housing defining at least a passageway extending between first and second surfaces. At least an electrical contact is moveably installed within the passageway with contacting ends extend beyond the surfaces. However, Matsuoka's device is too complicated to implement.

Therefore, there is a heretofore unaddressed need in the industry to address the aforementioned deficiencies and inadequacies.

SUMMARY OF THE INVENTION

Accordingly, an object of the present invention is to provide an electrical connector has an insulative housing with contact retaining structure.

To achieve the above-mentioned object, in a preferred embodiment of the present invention, the present invention provides an electrical connector for establishing electrical connection between an IC package (e.g. CPU) and a PCB. The electrical connector comprises an insulative housing, having a plurality of passageways extending thereof, and a plurality of contacts received in the passageways, respectively. Each of the passageways define two inner walls opposite to each other, each of the two inner walls having at least one first retention device. The contacts each include a base, an upper arm extending from one side of the base and a lower arm extending from another side of the base. The upper arm further defines two protrusions on opposite sides thereof and the lower arm defines two protrusions on opposite sides thereof. In assembly, the protrusions on upper arm are located above the first retention device of the passageways, and the protrusions on the lower arm are located below the first retention device of the passageways such that movement of the contact in the passageway along length axis of the passageway is limited in a predetermined distance. By manner abovementioned, the electrical connector provides a wiping displacement between contacts and the IC package.

Other objects, advantages and novel features of the present invention will become more apparent from the following detailed description when taken in conjunction with the accompanying drawings.

DETAILED DESCRIPTION OF THE PREFERRED EMBODIMENT OF THE INVENTION

Figure 1:
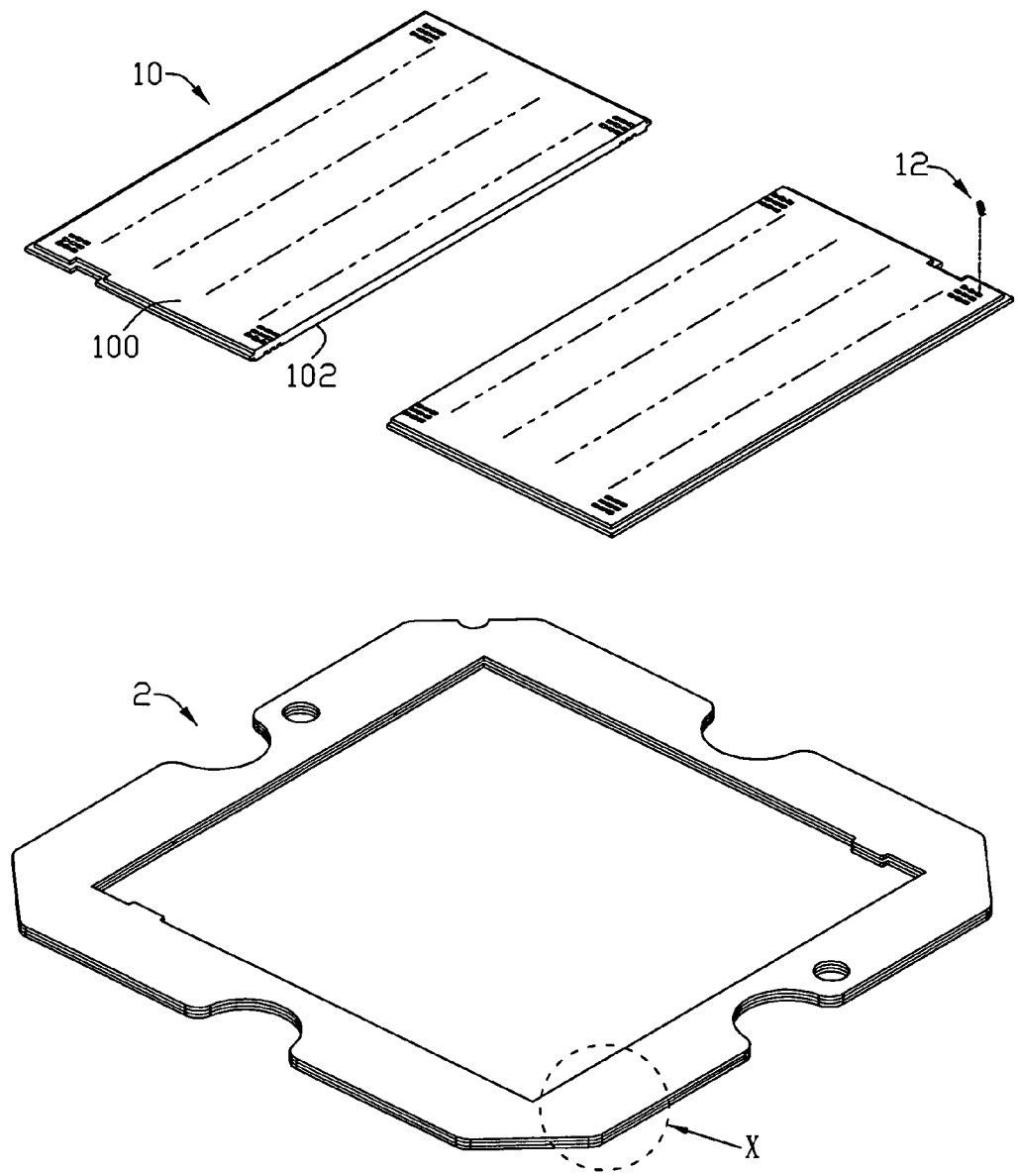
FIG. 1 is an exploded view of an electrical connector in accordance with a preferred embodiment.
Figure 2:
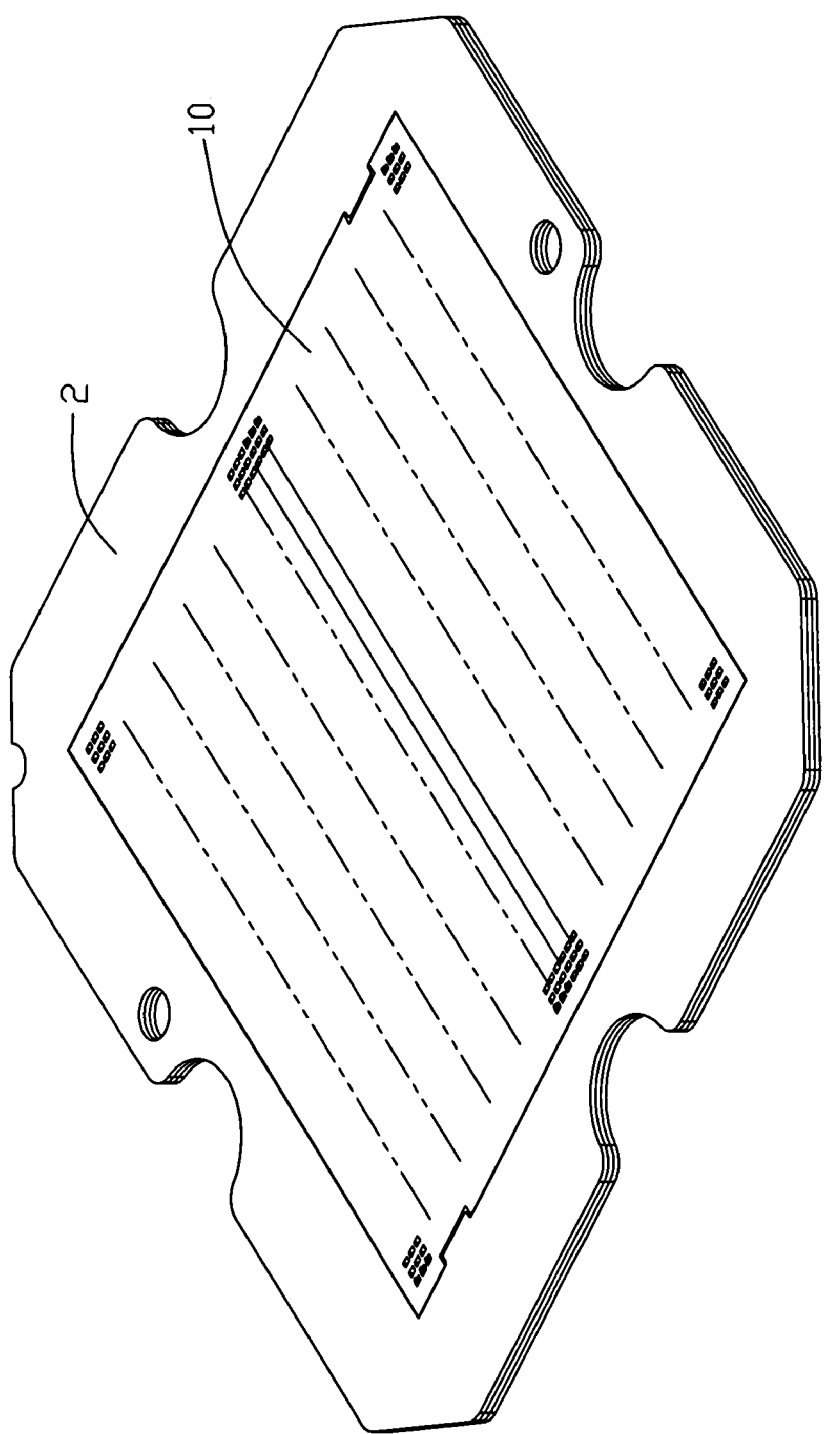
FIG. 2 is an assembly view of an electrical connector in accordance with a preferred embodiment.

Reference will now be made to accompany drawings to describe the present invention in detail.

Referring to FIGS. 1-6, according to a first preferred embodiment of the present invention, the electrical connector 1 comprises a housing assembly and a frame 2 surrounding the assembly. The housing assembly comprises two insulative housings 10 placed next to each other defining an interface region and the frame 2 holds the two housings 10 together. Each of the two insulative housings 10 has a mating interface 100 for supporting an IC package (e.g. CPU) and a mounting surface 102 opposite to the mating interface 100, a plurality of passageways 104 in matrix extending from the mating interface 100 toward the mounting surface 102, and a plurality of contacts 12 received in passageway 104, respectively.

Each of the passageways 104 defines two oblique inner walls 1040, 1042 opposite to each other, two interior walls 1044, 1046 opposite to each other and interconnecting said two oblique inner walls 1040, 1042. Each of the two interior walls 1044, 1046 has at least one first retention feature 1048.

The plurality of contacts 12 each define a base 120, an upper arm 122 extending from one side of the base 120 and a lower arm 124 extending from another side of the base 120. The upper arm 122 forms an upper contacting portion 1220 extending out of the mating interface 100 in a top end thereof and the lower arm 124 forms a lower contacting portion 1240 extending out of the mounting surface 102 in a bottom end thereof. The upper arm 122 comprises two spaced legs 1220, 1224 extending independently from the base 120. The two legs 1220, 1224 are arranged opposite to each other. The lower arm 124 also comprises two spaced legs 1240, 1244 extending independently from the base 120. The two legs 1240, 1244 are arranged opposite to each other. The upper arm 122 defines two protrusions 1226 on opposite sides thereof and the lower arm 124 defines two protrusions 1246 on opposite sides thereof. In detail, the protrusions 1226 are disposed at opposite exterior sides of the two legs 1220, 1224; and the protrusions 1246 are disposed at opposite exterior sides of the two legs 1240, 1244.

Figure 4:
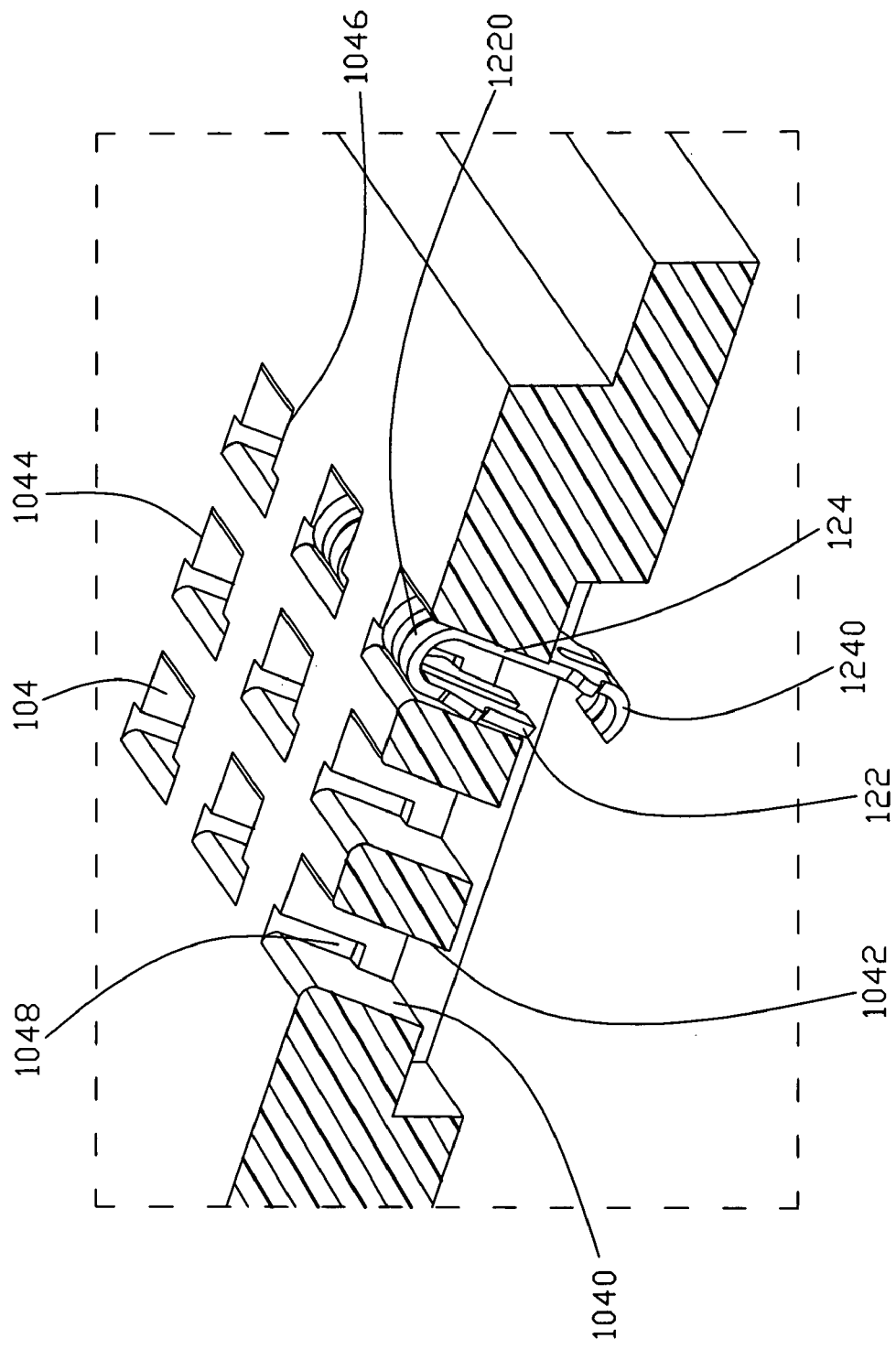
FIG. 4 is a perspective view of a part of an electrical connector in accordance with a preferred embodiment.
Figure 5:
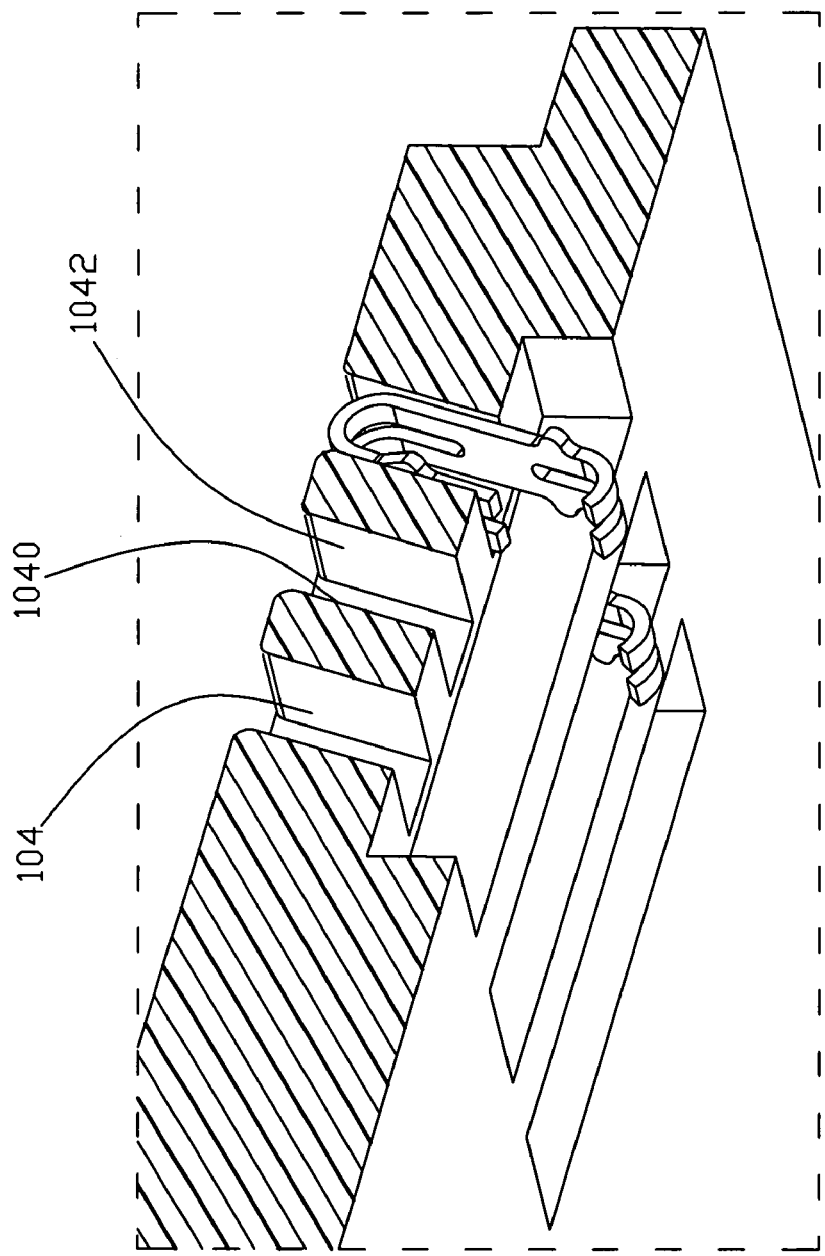
FIG. 5 is a perspective view of an electrical connector FIG. 4, from another perspective.
Figure 6:
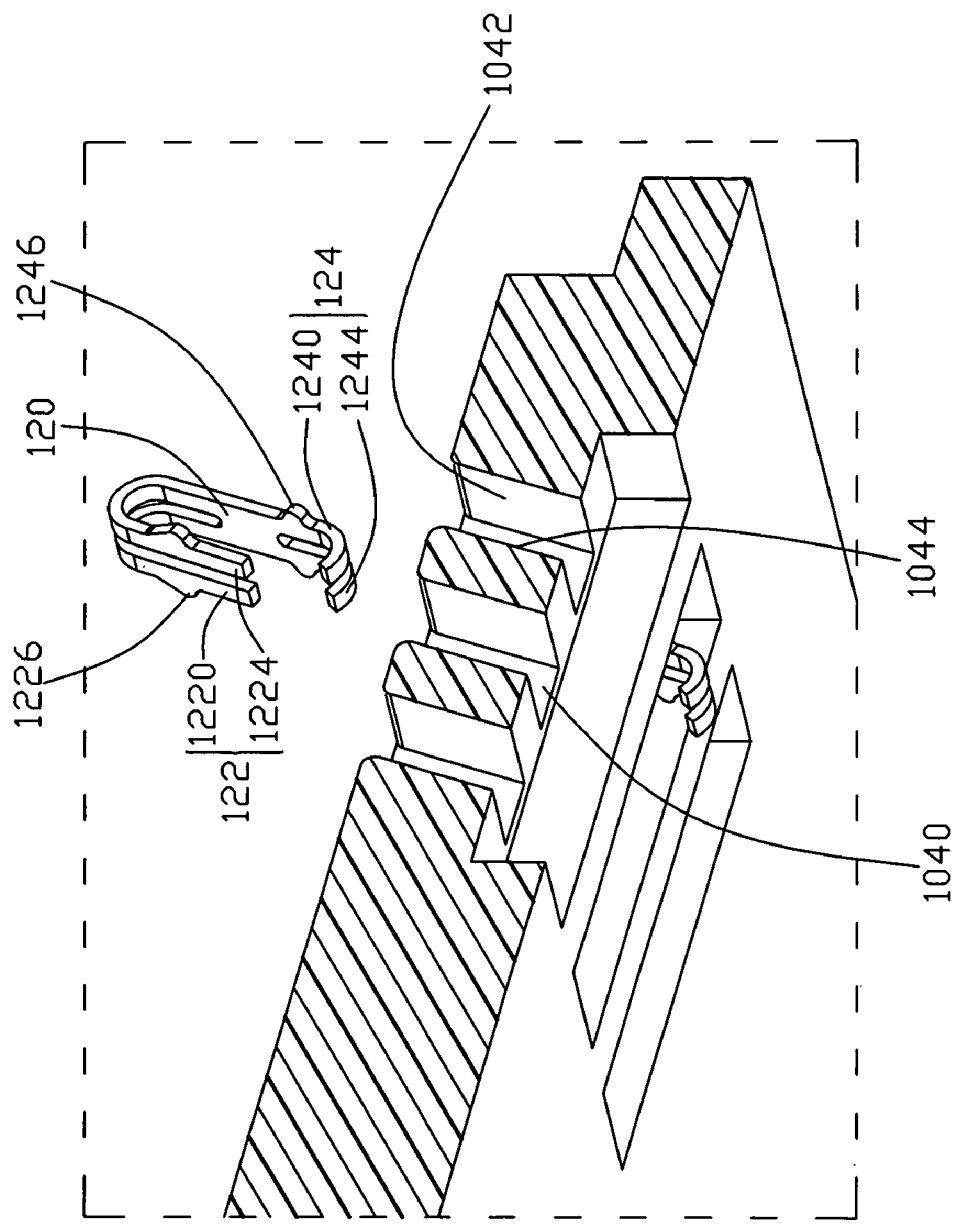
FIG. 6 is an explode view of an electrical connector in accordance with a preferred embodiment of the invention.

Referring FIGS. 4-6, in assembly, the contact 12 is inserted into the passageway 104 in a direction from the mounting surface 102 toward the mating interface 100. The upper arm 122 abuts against the oblique upper inner wall 1040 and the lower arm 124 abuts against the oblique lower inner wall 1042. The protrusions 1226 on upper arm 122 are located above the first retention feature 1046 of the passageways 104, and the protrusions 1246 on the lower arm 124 are located below the first retention feature 1046 of the passageways 104 such that movement of the contact 12 in the passageway 104 along length axis of the passageway 104 is limited in a predetermined distance. The protrusions 1226 don't allow the contact 12 to escape downward and the protrusions 1246 don't allow contact 12 to escape upward. In a word, the protrusions 1226 and 1246 form a second retention feature jointly.

Figure 3:
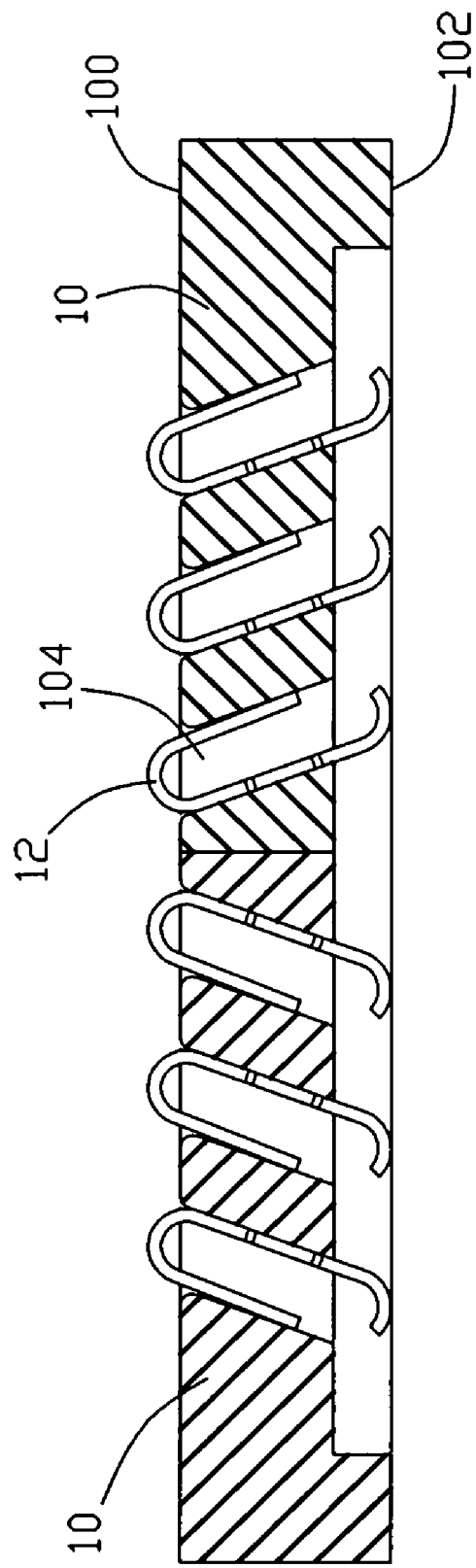
FIG. 3 is a cross section view of the electrical connector of FIG. 2.

Moreover, the two housings 10 each have a contacts layout different from each other. Referring to FIG. 3, the contacts 12 in two housings 10 are arranged in a back-to back manner. The oblique direction of the oblique passageway 104 in two housings 10 is opposite to each other and symmetrical with respect to a cent line defined by two housings 10. Thus, when the IC package is mounted on the electrical connector 10, the two housings 10 each exert a wiping force on the IC package. The wiping force from two housings 10 is occurred in an opposite direction such that composite wiping force on the IC package is canceled or substantially canceled. Each housing 10 has a group of oblique contacts 12 and defines a pitch between two adjacent contacts 12. Dimension of the pitch of one housing is equal to those in another one. Pitch between two groups of contacts of two housings 10 in the interface region is equal to said dimension of the pitch in two wafers. Due to manufacturing restrictions, it is impossible to have both oppositely oblique passageways in one housing, thus inventor use two housings 10 to resolve this problem. When the connector 1 mates with the IC package 2, it will meet need of continuous layout of the contacts, because IC package's pads are in a continuous format. The pitch remains uniform dimension across the two housings 10. In addition, the frame is formed from three pieces 2a, 2b and 2c. The three pieces are stacked together by place one on top of another.

Figure 7:
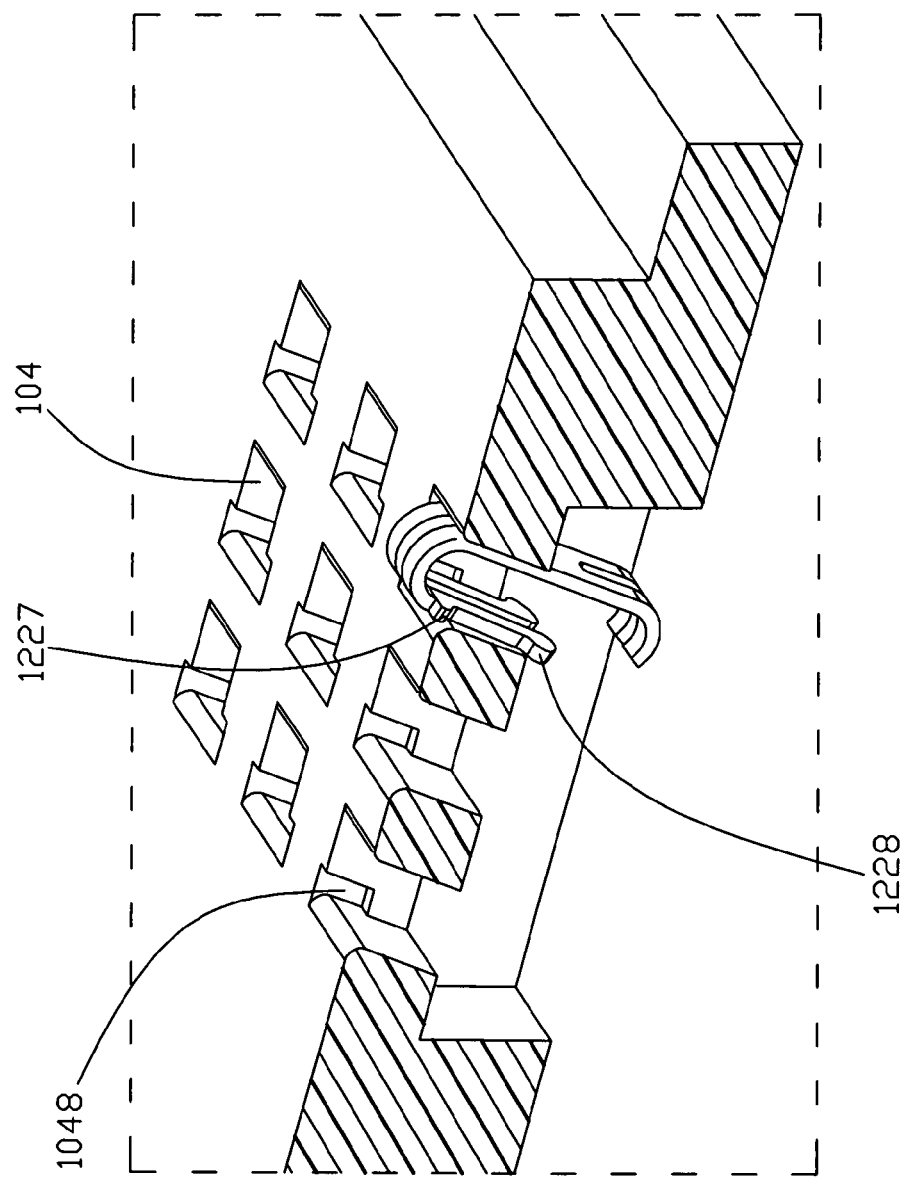
FIG. 7 is a perspective view of a part of an electrical connector in accordance with a preferred embodiment of the invention.
Figure 8:
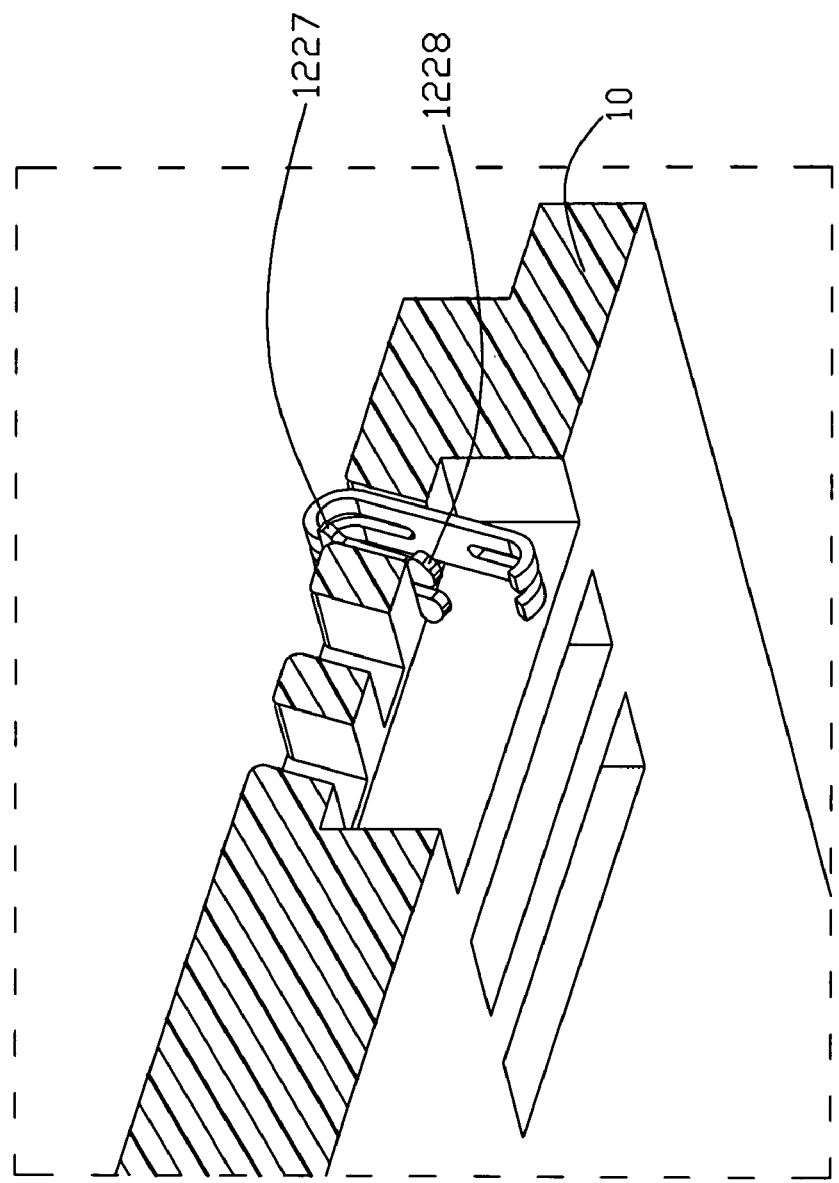
FIG. 8 is a perspective view of an electrical connector FIG. 7, from another perspective.
Figure 9:
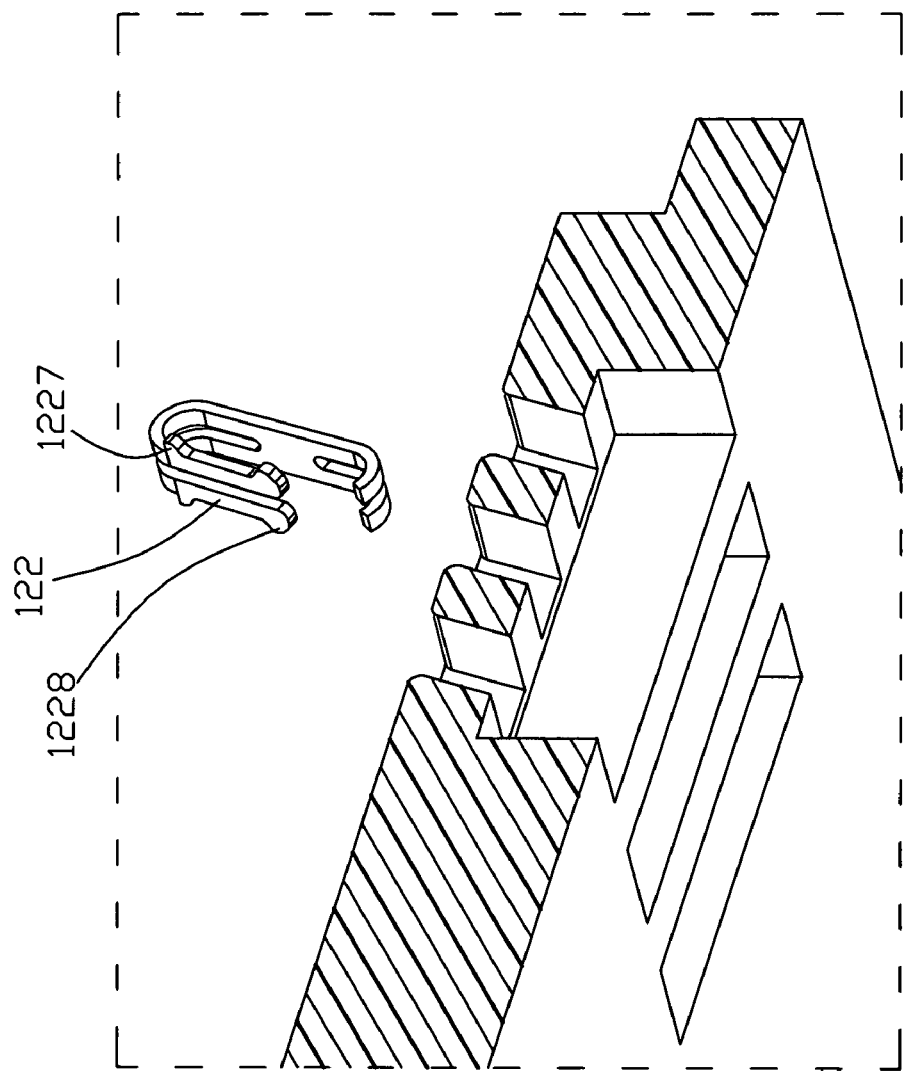
FIG. 9 is an explode view of an electrical connector in accordance with a preferred embodiment of the invention.

Referring to FIGS. 7-9, as an alternative, the second retention feature may be only arranged on the upper arm 122. The upper arm 122 defines two upper protrusions 1227 on a higher portion near the upper contacting portion 1220 along an oblique direction defined by the corresponding passageway 104 and two lower protrusions 1228 on a lower portion thereof along the oblique direction. In assembly, the upper arm 122 abuts against the upper inner wall 1040, and the protrusion 1227, 1228 is adapted to abutting against the first retention feature 1048 along the oblique direction defined by the corresponding passageway 104. By the method mentioned above, movement of the contact 12 in the passageway 104 along the oblique direction is limited in a predetermined distance.

Figure 10:
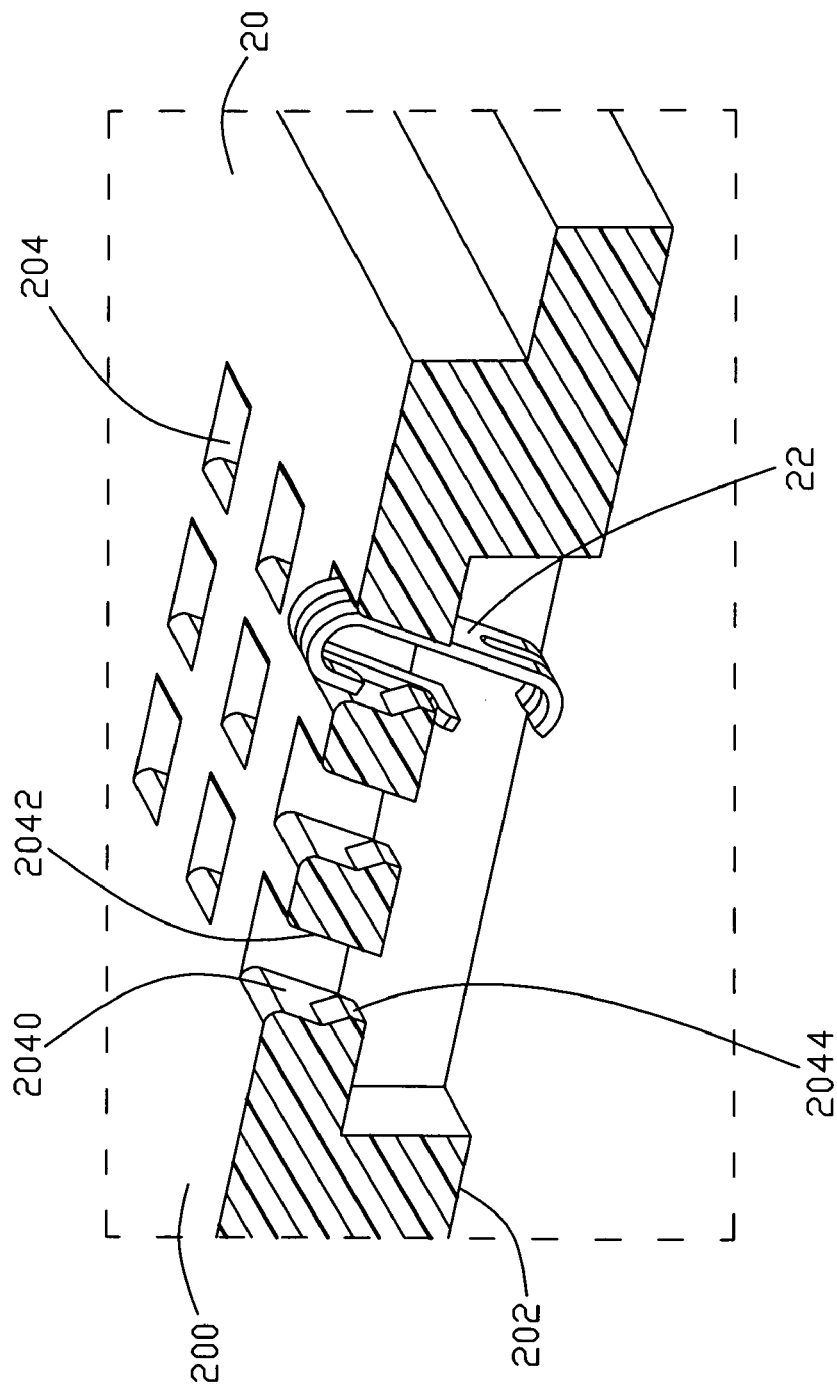
FIG. 10 is a perspective view of a part of an electrical connector in accordance with a preferred embodiment.
Figure 11:
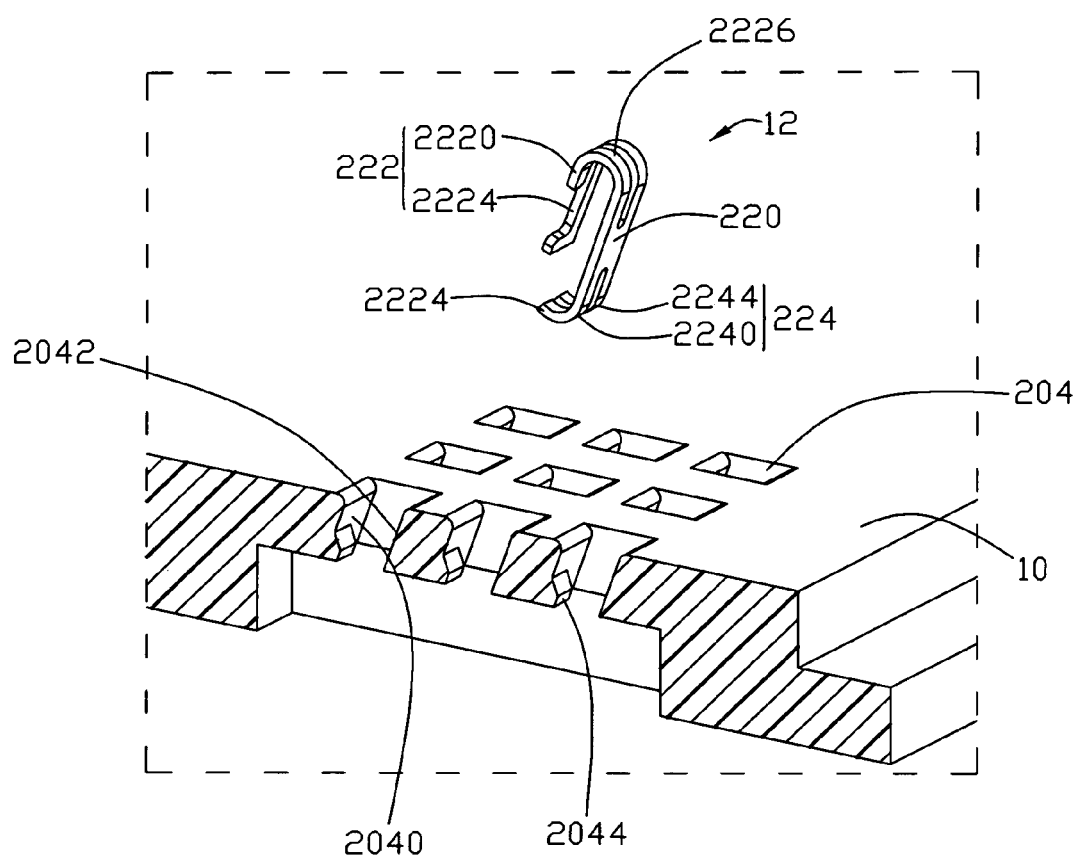
FIG. 11 is an explode view of an electrical connector in accordance with a preferred embodiment of the invention.
Figure 12:
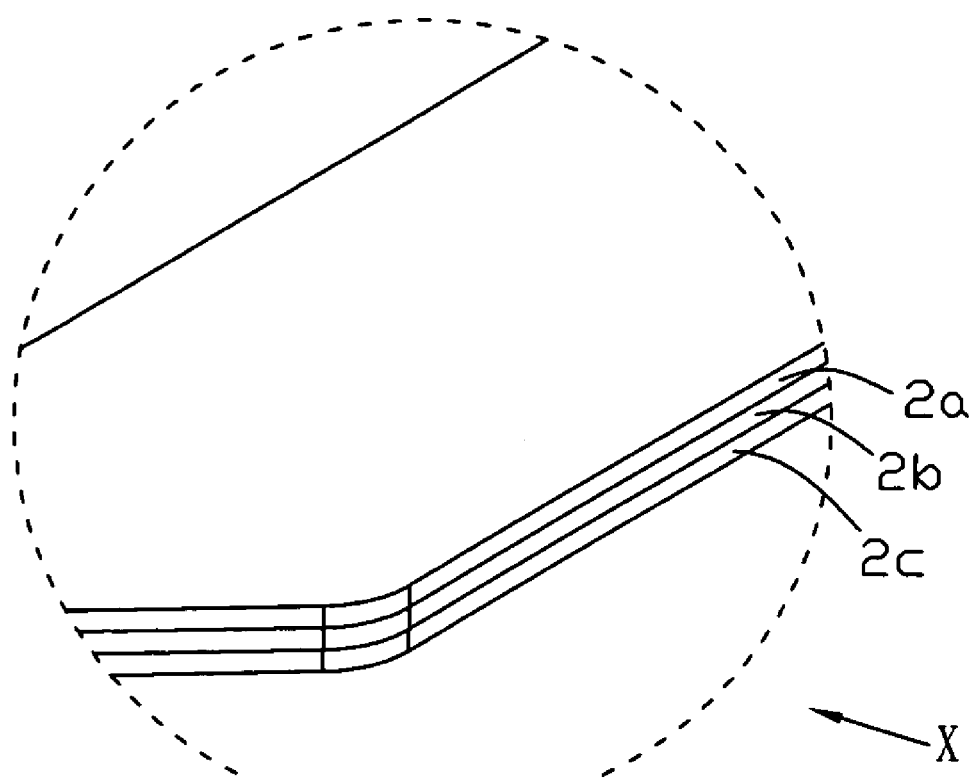
FIG. 12 is an enlarged view of the circled portion X of the FIG. 1.

Referring to FIGS. 10-11, an electrical connector 2 according to a second preferred embodiment of the present invention is shown. The electrical connector 2 comprises an insulative housing 20 having a mating interface 200 for supporting an IC package (e.g. CPU) and a mounting surface 202 opposite to the mating interface 200, a plurality of passageways 204 in matrix extending from the mating interface 200 toward the mounting surface 102 and a plurality of contacts 22 received in passageway 204, respectively.

Each of the passageways 204 defines an oblique upper inner wall 2040 and an oblique lower upper inner wall 2042 opposite to the oblique upper inner wall 2040. The upper inner wall 2040 defines a first retention feature, a protrusion 2044.

The plurality of contacts 22 each define a base 220, an oblique upper arm 222 extending from one side of the base 220 and an oblique lower arm 224 extending from another side of the base 220. The upper arm 222 forms an upper contacting portion 2220 extending out of the mating interface 200 in a top end thereof and the lower arm 224 forms a lower contacting portion 2240 extending out of the mounting surface 202 in a bottom end thereof.

The upper arm 222 comprises two spaced legs 2220, 2224 extending independently from the base 220. The two legs 2220, 2224 are arranged opposite to each other. The lower arm 224 also comprises two spaced legs 2240, 2244 extending independently from the base 220. The two legs 2240, 2244 are arranged opposite to each other.

The contacts 22 are arranged in the corresponding passageways 204, respectively. The oblique upper arm 222 compliantly abuts against the upper inner wall 2040 and the oblique lower arm 224 compliantly abuts against the lower inner wall 224. The leg 2220 of the upper arm 222 is shorter than the leg 2224. In assembly, a free end of the leg 2220 is located above the first retention feature 2044 (protrusion 2044) and the leg 2224 defines a free end extending to space below the protrusion 2044. By the method mentioned above, the contact 22 provides a second retention device corresponding to the first retention device 2044. In assembly, the first retention feature 2044 is adapted to abutting against the second retention device along an oblique direction defined by the corresponding passageway 204. The free end of the leg 2220 does not allow the contact 22 to escape upward and free end of the leg 2224 does not allow contact 22 to escape downward.

One important feature of the invention is that the arrangement of the oblique passageways in the housing for retaining the oblique contacts is the trend for miniaturization of the whole connector. Also, using two groups of oblique contacts in an opposite manner to counterbalance the wiping force is another trend. Understandably, it is impossible to have one insulative housing molded with such two opposite oblique passageways for receiving those opposite oblique contacts. Accordingly, two discrete housings are required for implementation. Anyhow, in the traditional plural housings in a frame, it essentially either has the partition formed by the frame to separate the housing or has the margins around the circumferential edge for isolating the respective housings from one another. Differently, in the instant invention, the edge regions of the two housings around the interface between the two housings still form the corresponding passageways therein so as to keep the same pitch of the contact/passageway not only in each housing but also between the interface of these two housings as shown in FIG. 3. Therefore, the instant invention can be advantageously used with the electronic package having the conductive pads on the undersurface with the constant pitch wholly.

Although the present invention has been described with reference to the accompanying drawings, it is not to be construed as being limited thereto. Various alterations and modifications can be made to the embodiments without in any way departing from the scope or spirit of the present invention as defined in the appended claims. Such modifications and alterations that may be apparent to a person skilled in the art are intended to be included within the scope of this invention as defined in by the accompanying claims.

What is claimed is:

1. An electrical connector comprising:
   an insulative housing assembly having two housings placed next to each other and defining an interface region therebetween, the two housings each defining a group of oblique passageways, oblique directions defined by said two housings oppositely angled to each other in a symmetrical manner; and
   two groups of contacts arranged in corresponding oblique passageways of the corresponding housings, and a pitch between two adjacent contacts in each groups of contacts being the same;
   wherein another pitch defined between the neighboring two contacts respectively belonging to said two groups is same as said pitch defined in the neighboring contacts in each respective group with increase in the interface region;
   wherein each of said passageways defining an oblique, upper inner wall and an oblique lower inner wall opposite to each other; each of said contacts defining an oblique upper contacting arm compliantly abutting against the upper inner wall and an oblique lower contacting arm compliantly abutting against the lower inner wall; wherein at least one of said upper inner wall and lower inner wall defines a first retention feature, and at least said upper contacting arm corresponding to the first retention feature, has a second retention feature under a condition that the first retention feature confronts and is adapted to abutting against the second retention feature along an oblique direction defined by the corresponding passageway;
   wherein the first retention feature is a protrusion arranged on the upper inner wall; and
   wherein the upper arm further comprising two legs spaced to each other, one of the two legs is shorter than the other one, wherein a free end of the shorter legs is located above the protrusion of the first retention feature while the longer leg has a free end extending to space below the protrusion.

2. The electrical connector as claimed in claim 1, wherein further comprises a frame surrounding the housing and holding the two housings together.

3. The electrical connector as claimed in claim 2, wherein the frame is formed from three pieces by stacked one on top of another.

4. An electrical connector comprising:
   an insulative housing defining a plurality of oblique passageways defined an oblique upper inner wall and an oblique lower inner wall extending through opposite upper and bottom faces of the housing, each of said passageways essentially defined by a pair of opposite oblique faces along which an oblique direction of said passageway is defined; and
   a plurality of contacts disposed in the corresponding passageways, respectively, each including a base, an upper arm extending from one side of the base and a lower arm extending from another side of the base, and essentially defining a long oblique plane seated upon one of said pair of oblique faces and a short oblique plane seated upon the other of said pair of oblique faces, an arc bight linking two upper ends of said long oblique plane and said short oblique planar for engagement with an electronic package seated above the upper face, and an arc section located at a bottom end of the long oblique plane for engagement with a printed circuit board;
   wherein each of said contacts defines a slot extending therealong from a distal end of the short oblique plane through the arc bight and terminated around a middle portion of the long oblique plane so as to have the short oblique plane formed with two opposite arms with said slot therebetween under a condition that said two opposite arms can be inwardly toward each other in a first transverse direction which is perpendicular to a second transverse direction defined by said pair of oblique faces;
   wherein the short oblique plane essentially downwardly faces to the long oblique plane;
   wherein a first retention feature is a protrusion arranged on the upper inner wall; and
   wherein the upper arm further comprising two legs spaced to each other, one of the two legs is shorter than the other one, wherein a free end of the shorter legs is located above the protrusion of the first retention feature while the longer leg has a free end extending to space below the protrusion.

5. The electrical connector as claimed in claim 4, wherein latching structures on formed on each of said short oblique plane to restrain up-and-down movement of the contact in the corresponding passageway.

* * * * *